United States Patent
Kyogoku

[11] Patent Number: 5,484,483
[45] Date of Patent: Jan. 16, 1996

[54] THERMAL TREATMENT APPARATUS

[75] Inventor: Mitsusuke Kyogoku, Tama, Japan

[73] Assignee: ASM Japan, K.K., Tokyo, Japan

[21] Appl. No.: 192,147

[22] Filed: Feb. 4, 1994

[51] Int. Cl.$^6$ .................................................. C23C 16/00
[52] U.S. Cl. .......................... 118/719; 118/715; 118/725; 118/733
[58] Field of Search ................................ 118/715, 725, 118/719, 733

[56] References Cited

FOREIGN PATENT DOCUMENTS

| | | | |
|---|---|---|---|
| 63-177426 | 7/1988 | Japan . | |
| 1-220435 | 9/1989 | Japan | 118/724 |
| 1-251610 | 10/1989 | Japan . | |
| 4-48725 | 2/1992 | Japan . | |

*Primary Examiner*—Richard Bueker
*Attorney, Agent, or Firm*—Knobbe, Martens, Olson & Bear

[57] ABSTRACT

A thermal treatment apparatus for semiconductor materials is configured to prevent a metal contamination caused by a metal manifold and maintain a sufficient sealing and isolation effect between a transfer system containing chamber and a reaction chamber even when there exists a significant difference in pressure between the two chambers.

A vent (7) having an inner diameter of 50 millimeter or greater for evacuating an inner section of a reaction chamber (1) made by quartz is provided in the reaction chamber (1). A seal flange is a double structure of a quartz flange (9) and a metal flange (10), and the metal flange is not emerged in the reaction chamber while the reaction chamber is sealed. Additionally, after the seal flange has been moved at a sealing position, a mobile section (12) is further moved such that the seal flange can not be pushed away by a pressure in the reaction chamber.

2 Claims, 6 Drawing Sheets

FIG. 1a
FIG. 1b
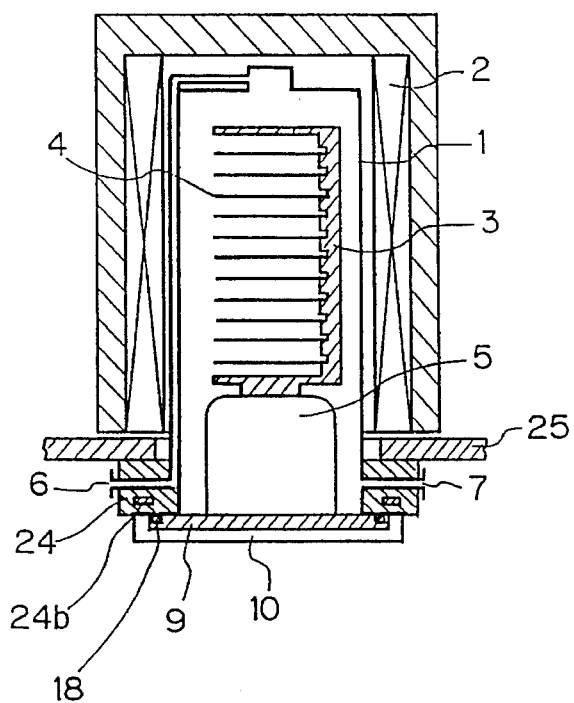
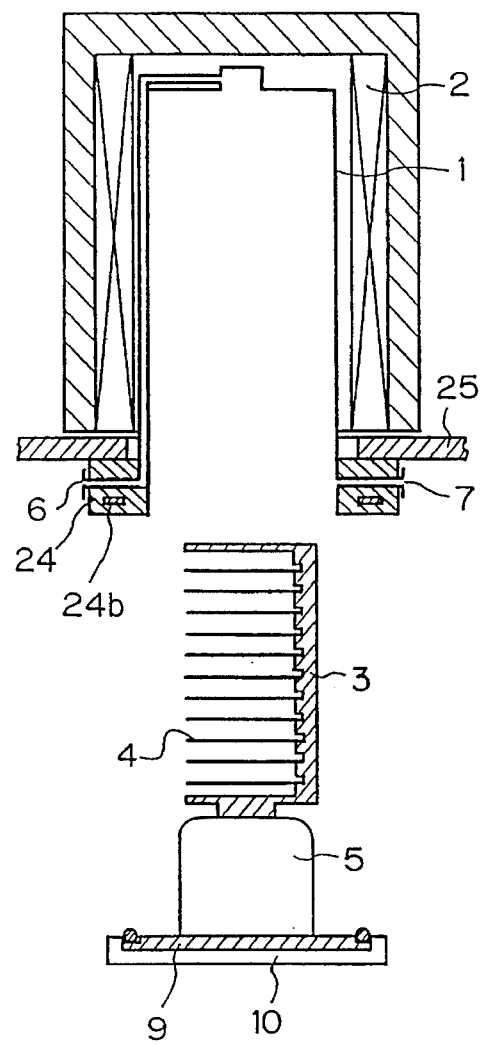

THERMAL TREATMENT APPARATUS

TECHNICAL FIELD

The present invention is relating to a semiconductor producing apparatus and, in particular, to an oxidation and diffusion apparatus.

BACKGROUND ART

FIGS. 1a, 1b and FIGS. 2a, 2b show a conventional longitudinal type thermal treatment apparatus and a conventional load locking thermal treatment apparatus respectively.

A heater (2) is located around a reaction chamber(I) made of a high-purity material such as quartz and the like, and an opened end of the reaction chamber (1) is sealed by a seal flange moved by a transfer system (not shown). A mobile section and the seal flange moved by the transfer system are connected by a spring member, so that it makes the sealing condition between the seal flange and the reaction chamber better. Because a pressure inside the reaction chamber during a process is slightly the same as an outer pressure, the spring member is required at least such resiliency that the spring member slightly pressurizes the seal flange onto the reaction chamber through a sealant. The seal flange is composed of a quartz flange (9) and a metal flange (10), and the quartz flange is only emerged inside the reaction chamber while the reaction chamber has been sealed. A gas introducing inlet (6) is provided in the reaction chamber (1), and communicating this with another closed end of the reaction chamber along a side wall outside the chamber, then a gas is introduced into the chamber through there. A gas vent (7) is provided about the opened end of the reaction chamber, and the gas is vented through there. A boat table (5) and a boat (3) supporting, like a multi layer, a plurality of thermal treatment sections (4) are provided on the seal flange, and they are moved into and out from the reaction chamber by the transfer system.

When the boat has been moved out from the reaction chamber (1) (FIG. 1b) by the transfer system, workpieces are set on the boat. The boat is moved into the reaction chamber by the transfer system, the flange is sealed and the reaction chamber is also sealed. An inactive gas, such as nitrogen gas, is introduced from the gas introducing inlet, and an atmospheric compound mixed into the chamber during moving the boat is purged. Achieving the workpiece to the predetermined temperature by the heater, then a gas for the predetermined process is introduced. Oxygen and the like is introduced for the dry oxidation process. Vapour and the like, which is produced by burning oxygen and hydrogen at an outer combustion device (not shown) provided before the introducing inlet (6), is introduced for the wet oxidation process, or oxyphosphorus chloride ($POCl_3$) and the like is introduced for the phosphorus dispersion process. The internal diameter of the introducing inlet is typically from about 10 mm to about 20 mm. The vent (7) is opened to the atmospheric environment and after an introduced gas contributes to the predetermined reaction, it is vented from the vent such that it is pressurized. The internal diameter of the vent is typically from about 10 mm to about 20 mm, and it is usually larger than the internal diameter of the introducing inlet. After completing the process, the introduction of a process gas is stopped, and after purging nitrogen gas and the like again, the boat is moved out from the reaction chamber by the transfer system.

Recently, according to the higher integration of a semiconductor device, in order to prevent an unpredictable oxidation caused by atmospheric compounds (oxygen, aqueous vapour and the like) and a residual process gas inside the reaction chamber after a process, the load locking thermal treatment apparatus has been developed. The examples are shown in FIG. 2a and FIG. 2b. A transfer system comprising a ball screw (13), a mobile section (12) and the like is set in a transfer system containing chamber (11) to seal to the atmosphere. The transfer system containing chamber (11) has a vent (15) to evacuate inside the chamber (11). Carring out a process at the atmospheric pressure, then a force is produced to open and to push the sealed flange by the pressure difference between the pressure inside the reaction chamber and the pressure inside the transfer system containing chamber. Thus, the sealed flange and the mobile section (12) are connected by a rigid member without the spring member and the pressure inside the transfer system containing chamber (11) is maintained about the atmospheric pressure by introducing the high purity nitrogen gas after evacuating, only during the process or all the time. The open section (14) is provided for moving a workpiece into or out from the transfer system containing chamber (11) and is connected with a front room (17) through a gate valve (16). A carrier system is contained to move the workpiece into or out from the boat from the open section in the front room. A metal manifold (23) having a vent (7b) is provided by connecting with the reaction chamber to evacuate the inner section of the reaction chamber comprising a high purity material such as quartz, and this manifold has a cooling section (3b). After completing the process, evacuating the inner section to about $10^{-6}$ torr by the evacuating system connecting to the vent (7b), unloading the boat, then the workpiece is taken out.

The metal manifold has been provided to evacuate the inner section of the reaction chamber for the load locking thermal treatment apparatus which has been developed to embody the treatment of a higher integrated device, however, a heavy metal contamination is caused to the workpiece thereby and this causes to retrograde the performance of the apparatus. Because the oxidation process is carried out by a high temperature such as typically about 1000° C., its thermal radiation greatly affects. It may not be escaped that a metal contamination becomes to be larger than a metal contamination caused by an apparatus whose entire surface inside the reaction chamber is quartz such as a conventional oxidation diffusion apparatus, even if a cooling section is provided. Additionally, if over cooling is done, then vapour and the like will be condensated with dews on the surface inside the manifold at the wet oxidation, and it will exert further serious bad influences such as the metal corrosion and the like. Also, the thermal diffusion from the lower section of the heater becomes larger by the cooling, and it then causes the average thermal characteristic of the heater to be worse.

If the transfer system containing chamber is filled by high purity nitrogen gas after evacuating, the degree of cleanliness of the environment in the apparatus has a limit depended on the degrees of cleanliness of a supplied nitrogen gas and a gas supplying system. In order to respond to the request to a device of the further degree of integration, the pressure in the transfer system containing chamber is required to maintain in the high vacuum environment below $10^{-7}$ torr for further reducing the densities of residual oxygen, vapour and the like. If the environment of the transfer system containing chamber becomes the state of the atmospheric pressure by nitrogen gas during the process below the atmospheric pressure and the evacuation is done after completing the process, the throughput by the apparatus decreases and the cost of the supplied high purity nitrogen gas increases. If the mobile section and the seal flange are connected by a rigid member each other, the accuracy of the stop position of the mobile section and the degree of the parallelization between the seal flange and the interfacing surface should be strictly monitered, and thus the manufacturing cost can increase and the great skill is also required to incorporate again after the reaction chamber maintenance.

DISCLOSURE OF THE INVENTION

A vent is provided in a reaction chamber to evacuate its inner section. A seal flange has a doubled structure of a quartz flange and a metal flange and seales through a sealant between the reaction chamber and the quartz flange.

A spring member connects between the seal flange and a mobile section, and after moving the seal flange to a sealing position, the mobile section is moved, then stopped and held so that the magnitude of a resiliency of the spring member produced by further moving the mobile section is larger than the magnitude of a force acting from the reaction chamber to the seal flange when a pressure in a transfer system containing chamber is in vacuum and a pressure in the reaction chamber is at the atmospheric pressure.

BRIEF DESCRIPTION OF DRAWINGS

FIG. 1a shows a conventional thermal treatment apparatus.

FIG. 1b shows a conventional thermal treatment apparatus moved out the boat table from a reaction chamber.

PREFERRED EMBODIMENT OF THE PRESENT INVENTION

Figure 2A:
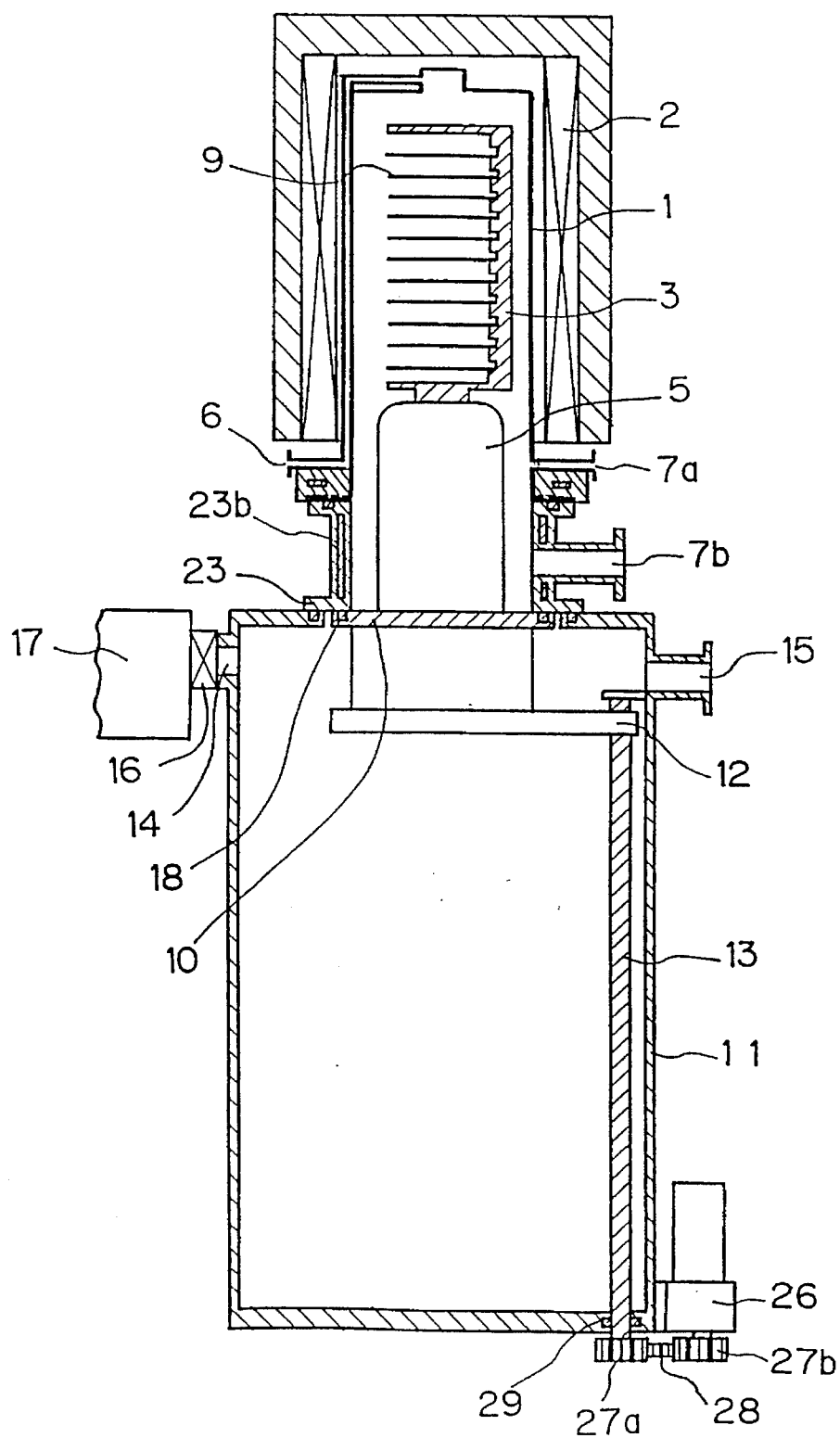
FIG. 2a shows a conventional load locking thermal treatment apparatus.
Figure 2B:
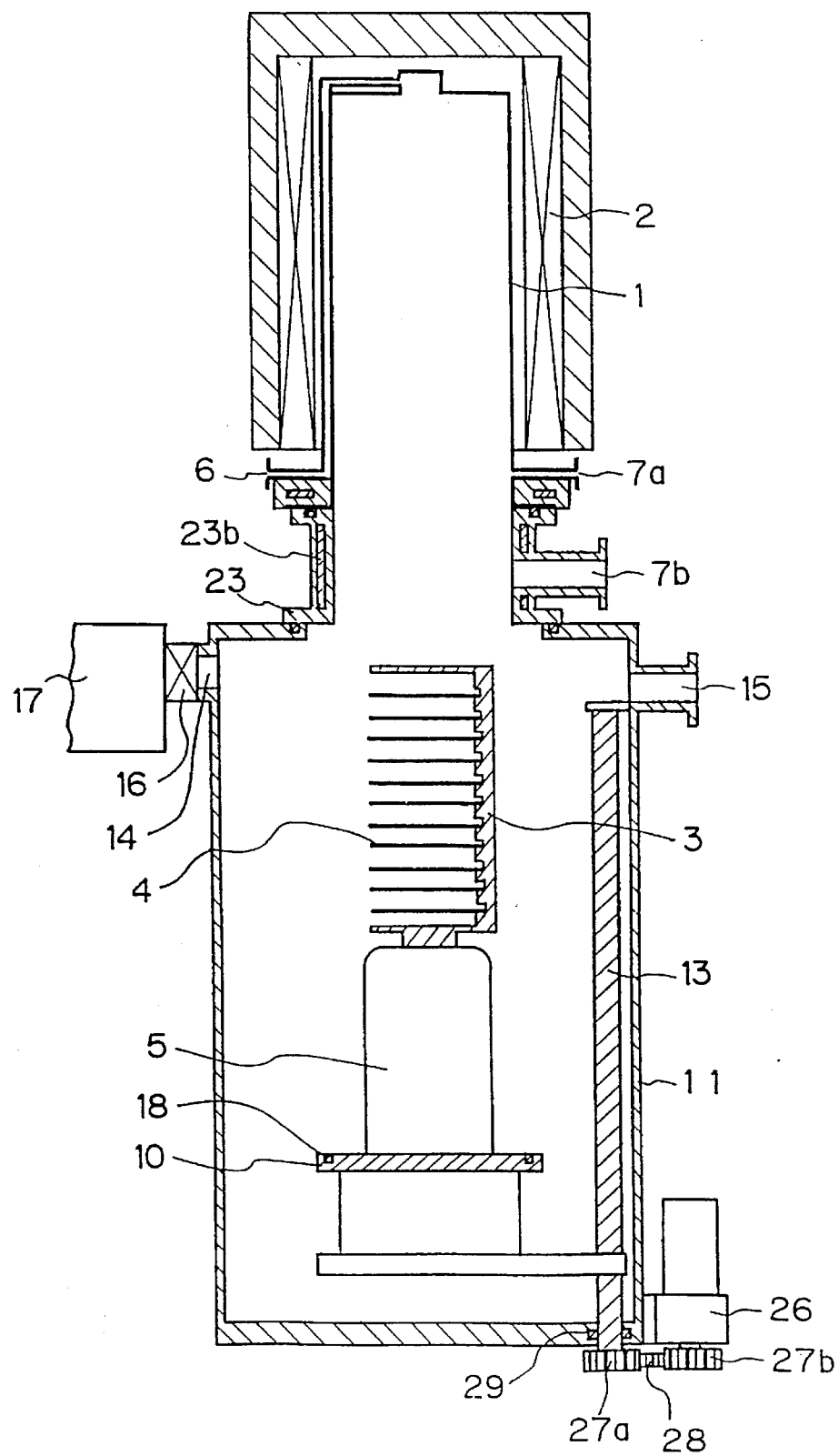
FIG. 2b shows a conventional load locking thermal treatment apparatus moved out a boat table from a reaction chamber.
Figure 3:
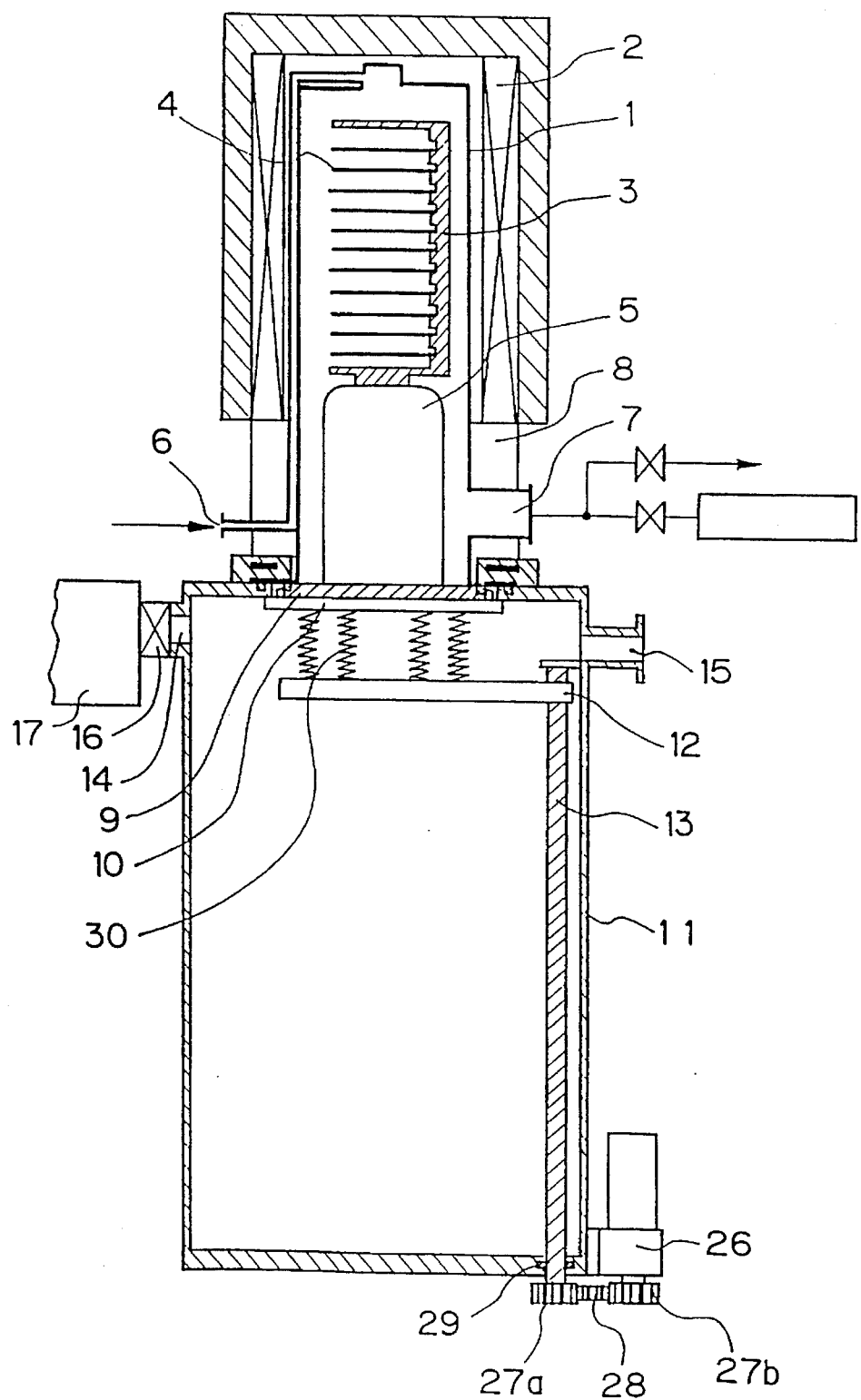
FIG. 3 shows an apparatus according to the present invention.
Figure 4A:
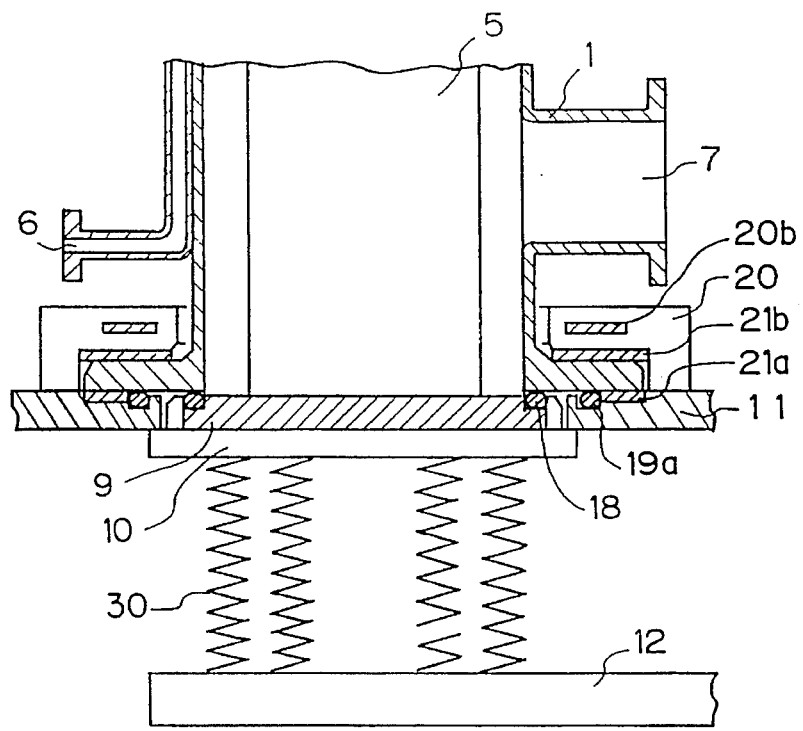
FIG. 4a shows a partial enlarged view of the apparatus shown in FIG. 3.

FIG. 3 shows one embodiment of the present invention. FIG. 4a is a partial enlarged view of FIG. 3.

A vent (7) is provided in a reaction chamber (1) to evacuate inside the chamber. The internal diameter of the vent should be at least over about 50 mm to evacuate inside the reaction chamber in short period. In the present invention, the internal diameter of the reaction chamber and the vent are 240 mm and 100 mm respectively, but it is no problem in the stiffness and the like if it is structured by quartz. A vent line at the process in the atmospheric pressure may be provided and may be branched before the vent (7). By mounting a heat insulator (8) around the reaction chamber before and after the vent (7), heat escaped from this section is prevented and the average thermal characteristic of the heating unit is improved. The temperature on the wall inside the reaction chamber is kept at such a temperature that does not condensate vapour with dews in the inner section during the wet oxidation process.

Figure 4B:
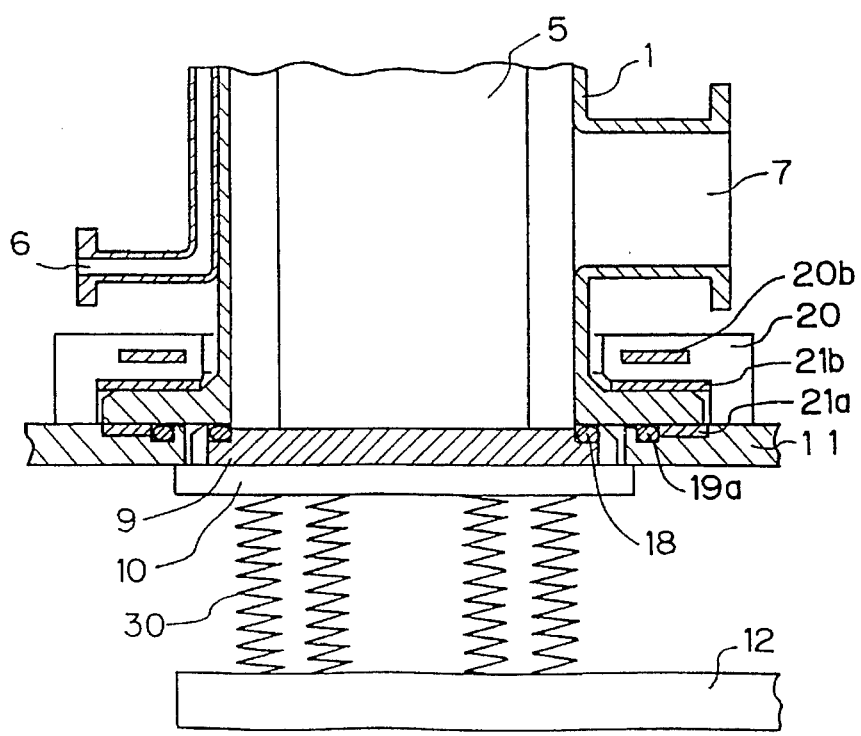
FIG. 4b shows a partial enlarged view of the apparatus shown in FIG. 3.

The quartz flange (9) placing a boat (3) and a boat table (5) is set on the metal flange (10) and then moved by the transfer system. When the boat (3) is moved to a predetermined position in the reaction chamber (1), the sholder section of metal flange touches to the sholder section (11) of the transfer system containing chamber and it is then unable to move any more. At this time, there is a small annulus between the quartz flange and the reaction chamber, and it is sealed by a sealant (18) comprising of fluoro rubber and the like. Thus, the quartz may not be broken because each quartz does not collide and an excess force does not apply on the parts of quartz. Supposing that the dimention of mobile section (12) and the metal flange (10) is represented by [A] at this time, the mobile section (12) is further moved and becomes the dimention of [B]. As shown in FIG. 4b, by the resiliency of the spring member i.e. a magnitude of multipling the spring coefficient of a spring member (30) by the amount of compression [A-B], the metal flange (10) is pressurized on the sholder section of the transfer system containing chamber (11). The process in the atmospheric pressure is carried out by keeping the transfer system containing chamber in vacuum with this state. At this time, a magnitude of a force which is multiplied the effective area of the internal diameter of the sealant (18) by the pressure difference between two chambers excerts from the transfer system containing chamber to the seal flange. The amount of the compression [A-B] and the spring coefficient of the spring has been determined such that the spring resiliency is larger than the magnitude of the force. Even if excerting the force by the pressure difference downwards, the quartz flange cannot be broken because the metal flange (10) employs to the quartz flange as reinforced. The metal flange (10) can not be moved downwards because a force above the magnitude of a force employing from the transfer system containing chamber is excerted upwards by the spring member. Thus, the process gas can not leak to the transfer system containing chamber during the process. A flange section of the end section of the reaction chamber (1) is mounted through a sealant (19a) and a cushioning material (21a) on the mobile system containing chamber (11) and is fixed through the cushoning material (21b) by a fixed flange (20) having a cooling section (20b). The cooling section may be provided in the transfer system containing chamber side.

Figure 4C:
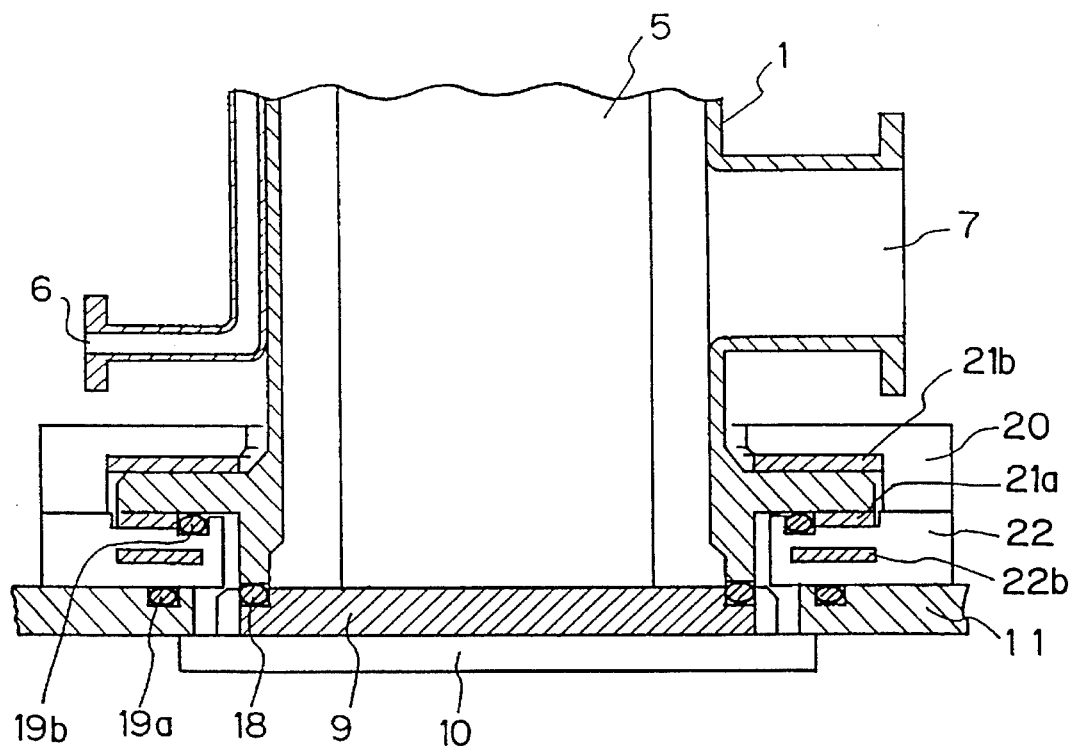
FIG. 4c shows a partial enlarged view of another embodiment.

FIG. 4c shows a partial enlarged view of another embodiment. The reaction chamber (1) is defined as a tube shape up to the lower side of the flange section, is expaned the internal diameter about its end section and is sealed at the end section. By this, heat energy as a beam propagating in the transparent inner section of the quartz is reflected and a heat influence to the sealant (18) can be reduced. The flange section of the reaction chamber (1) is fixed on a flange (22) having means for cooling and the flange (22) is fixed on the transfer system containing chamber (11).

I claim:

1. A thermal treatment apparatus for semiconductor materials comprising:

a reaction chamber for providing a predetermined chemical reaction to the semiconductor materials;

a heating system around said reaction chamber;

a transfer system for moving a boat supporting workpieces of the semiconductor materials into and out from said reaction chamber;

a transfer system containing chamber for insulating said transfer system from the atmosphere;

a vent provided on a wall of said reaction chamber in order to evacuate gases in said reaction chamber, said vent being positioned between said heater and said transfer system containing chamber, an inner diameter of said vent being more than 50 millimeter;

a seal flange is driven by said transfer system, and said seal flange separates the transfer system containing chamber from the reaction chamber;

said seal flange is a double structure comprising of an upper flange section made of a high purity material and a lower flange section made of a metal material, such that the upper flange and the reaction chamber are sealed through a sealant when the lower flange is positioned at its movable limit;

said seal flange and a mobile section is connected by a spring member, said mobile section is moved by said transfer system, a resiliency of said spring member, which is produced by moving the mobile section after moving the seal flange to the movable limit, is greater than such a force that exerts to push and open the flange when a process pressure in the reaction chamber is greater than a pressure in said transfer system containing chamber during the process, so that the mobile section is stopped and held at said movable limit.

2. A thermal treatment apparatus according to claim 1, further includes an evacuating system for evacuating the inside of said reaction chamber, said evacuating system controlling a chamber pressure in a range of 10 torr to $10^{-3}$ torr.

* * * * *